United States Patent
Park et al.

(10) Patent No.: US 11,466,383 B2
(45) Date of Patent: Oct. 11, 2022

(54) SILICON CARBIDE INGOT, METHOD OF PREPARING THE SAME, AND METHOD FOR PREPARING SILICON CARBIDE WAFER

(71) Applicant: SENIC INC., Cheonan-si (KR)

(72) Inventors: Jong Hwi Park, Suwon-si (KR); Myung-Ok Kyun, Suwon-si (KR); Jongmin Shim, Hwaseong-si (KR); Byung Kyu Jang, Suwon-si (KR); Jung Woo Choi, Suwon-si (KR); Sang Ki Ko, Suwon-si (KR); Kap-Ryeol Ku, Suwon-si (KR); Jung-Gyu Kim, Suwon-si (KR)

(73) Assignee: SENIC INC., Cheonan-si (KR)

( * ) Notice: Subject to any disclaimer, the term of this patent is extended or adjusted under 35 U.S.C. 154(b) by 86 days.

(21) Appl. No.: 16/917,387

(22) Filed: Jun. 30, 2020

(65) Prior Publication Data
US 2021/0115592 A1    Apr. 22, 2021

(30) Foreign Application Priority Data
Oct. 22, 2019    (KR) .................. 10-2019-0131176

(51) Int. Cl.
*C30B 29/36* (2006.01)
*C30B 23/00* (2006.01)
(Continued)

(52) U.S. Cl.
CPC ............ *C30B 29/36* (2013.01); *C01B 32/956* (2017.08); *C30B 23/002* (2013.01); *C30B 23/06* (2013.01); *H01L 21/02002* (2013.01)

(58) Field of Classification Search
None
See application file for complete search history.

(56) References Cited

U.S. PATENT DOCUMENTS

| | | | | |
|---|---|---|---|---|
| 2012/0294790 A1* | 11/2012 | Sasaki | ................... | C30B 23/025 428/137 |
| 2018/0282902 A1 | 10/2018 | Nakabayashi | | |
| 2019/0194823 A1* | 6/2019 | Fujikawa | ................ | C30B 29/36 |

FOREIGN PATENT DOCUMENTS

| | | |
|---|---|---|
| CN | 103476975 A | 12/2013 |
| JP | 2008-110907 A | 5/2008 |

(Continued)

OTHER PUBLICATIONS

"Heating insulation graphite barrel", *CFCCARBON HTMAGROUP*, Accessed Nov. 4, 2011 (5 pages in English).

*Primary Examiner* — Guinever S Gregorio
(74) *Attorney, Agent, or Firm* — NSIP Law

(57) ABSTRACT

A SiC ingot includes: a main body including a first cross-sectional plane of the main body and a second cross-sectional plane of the main body facing the first cross-sectional plane; and a protrusion disposed on the second cross-sectional plane and including a convex surface from the second cross-sectional plane of the main body, wherein a first end point disposed at one end of the second cross sectional plane, a second end point disposed at another end of the second cross sectional plane, and a peak point disposed on the convex surface are disposed on a third cross-sectional plane of the main body perpendicular to the first cross-sectional plane, and wherein a radius of curvature of an arc corresponding to a line of intersection between the third cross-sectional plane and the convex surface satisfies Equation 1 below:

$$3D \leq r \leq 37D \qquad \text{[Equation 1]}$$

where r is the radius of curvature of the arc corresponding to the line of intersection between the third cross-sectional (Continued)

plane and the convex surface, and D is a length of a line of intersection between the first cross-sectional plane and the third cross-sectional plane.

4 Claims, 6 Drawing Sheets

(51) Int. Cl.
    *C30B 23/06*     (2006.01)
    *C01B 32/956*     (2017.01)
    *H01L 21/02*     (2006.01)

(56) References Cited

FOREIGN PATENT DOCUMENTS

| | | |
|---|---|---|
| JP | 2011-195360 A | 10/2011 |
| JP | 2012-510951 A | 5/2012 |
| JP | 2014-114169 A | 6/2014 |
| JP | 2015-63435 A | 4/2015 |
| JP | 2015-093823 A | 5/2015 |
| JP | 2015-117143 A | 6/2015 |
| KR | 10-2006-0059434 A | 6/2006 |
| KR | 10-0977624 B1 | 8/2010 |
| KR | 10-2016-0055102 A | 5/2016 |
| KR | 10-2016-0084987 A | 7/2016 |
| KR | 10-1680215 B1 | 11/2016 |
| KR | 10-1692142 B1 | 1/2017 |
| KR | 10-1744287 B1 | 6/2017 |
| KR | 10-2017-0099958 A | 9/2017 |
| KR | 10-2104751 B1 | 4/2020 |
| WO | WO 2014/123036 A1 | 8/2014 |

\* cited by examiner

SILICON CARBIDE INGOT, METHOD OF PREPARING THE SAME, AND METHOD FOR PREPARING SILICON CARBIDE WAFER

CROSS-REFERENCE TO RELATED APPLICATIONS

This application claims the benefit under 35 U.S.C. 119(a) of Korean Patent Application No. 10-2019-0131176 filed on Oct. 22, 2019, in the Korean Intellectual Property Office, the entire disclosure of which is incorporated herein by reference for all purposes.

BACKGROUND

1. Field

The present disclosure relates to a silicon carbide ingot, a method for preparing the same, and a method for preparing a silicon carbide wafer.

2. Description of the Background

Silicon carbide (SiC) is a semiconductor with a wide band gap of 2.2 eV to 3.3 eV, and research and development has been progressing due to its excellent physical and chemical characteristics as a semiconductor material.

As methods for preparing a SiC single crystal, there are Liquid Phase Epitaxy (LPE), Chemical Vapor Deposition (CVD), Physical Vapor Transport (PVT), and the like. Among them, the PVT is a method of growing a SiC single crystal as follows: loads SiC raw materials into a crucible, places a seed crystal composed of a SiC single crystal on the top of the crucible, and then heats the crucible by an induction heating method to sublimate the raw materials such that the SiC single crystal grows on the seed crystal. PVT is the most widely used process for a preparation of a SiC in the form of an ingot at high growth rate. However, a current density changes depending on characteristics of the crucible, processing conditions, etc., and the temperature distribution inside the crucible also changes, making it difficult to secure stable reproduction of the growth of the SiC.

Methods for producing a SiC may include "SILICON CARBIDE SINGLE CRYSTAL WAFER AND METHOD OF MANUFACTURING A SILICON CARBIDE SINGLE CRYSTAL INGOT" disclosed in Korean Unexamined Patent Publication No. 10-2016-0055102, "METHOD FOR PRODUCING SILICON CARBIDE SINGLE CRYSTAL INGOT AND SILICON CARBIDE SINGLE CRYSTAL INGOT" disclosed in Korean Unexamined Patent Publication No. 10-2017-0099958 and etc.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a SiC ingot includes: a main body including a first cross-sectional plane of the main body and a second cross-sectional plane of the main body facing the first cross-sectional plane; and a protrusion disposed on the second cross-sectional plane and including a convex surface from the second cross-sectional plane of the main body, wherein a first end point disposed at one end of the second cross sectional plane, a second end point disposed at another end of the second cross sectional plane, and a peak point disposed on the convex surface are disposed on a third cross-sectional plane of the main body perpendicular to the first cross-sectional plane, and wherein a radius of curvature of an arc corresponding to a line of intersection between the third cross-sectional plane and the convex surface satisfies Equation 1 below:

$$3D \leq r \leq 37D \qquad [\text{Equation 1}]$$

where r is the radius of curvature of the arc corresponding to the line of intersection between the third cross-sectional plane and the convex surface, and D is a length of a line of intersection between the first cross-sectional plane and the third cross-sectional plane.

The first cross-sectional plane of the main body may be in contact with a SiC seed crystal.

The main body may have a cylindrical shape having an axis perpendicular to the first cross-sectional plane and passing through a center of the first cross-sectional plane.

An area of a cross section perpendicular to the axis may be same along the axis from the first cross-sectional plane to the second cross-sectional plane.

An area of a cross section perpendicular to the axis may increase along the axis from the first cross-sectional plane to the second cross-sectional plane.

A number of pits on a surface of the SiC ingot may be 10,000/cm² or less.

The SiC ingot may have a 4H-SiC crystal structure, and a locking angle of a wafer prepared from the SiC ingot with an off angle to a (0001) plane of the SiC ingot set as 0 to 10 degree may be −1.5 degree to +1.5 degree relative to a reference angle.

The locking angle of the wafer prepared from the SiC ingot with the off angle to the (0001) plane of the SiC ingot set as 8 degree may be −1.5 degree to +1.5 degree relative to the reference angle.

The locking angle of the wafer prepared from the SiC ingot with the off angle to the (0001) plane of the SiC ingot set as 4 degree may be −1.5 degree to +1.5 degree relative to the reference angle.

The locking angle of the wafer prepared from the SiC ingot with the off angle to the (0001) plane of the SiC ingot set as 0 degree may be −1.0 degree to +1.0 degree relative to the reference angle.

The diameter of the first cross-sectional plane of the main body may be 4 inches or more.

In another general aspect, a SiC ingot includes: a main body including a first cross-sectional plane of the main body and a second cross-sectional plane of the main body facing the first cross-sectional plane; and a protrusion disposed on the second cross-sectional plane and including a convex surface, wherein the SiC ingot includes a first reference line perpendicular to the first cross-sectional plane of the main body and passing through a center of the first cross-sectional plane of the main body, a second reference line parallel to the first reference line and in contact with an edge of the protrusion disposed farthest from the first reference in a vertical distance, a third reference line parallel to the first cross-sectional plane of the main body and passing through a contact point between the edge of the protrusion and the second reference line, and a fourth reference line passing through the contact point and a peak point of the convex surface, and wherein an angle between the third reference line and the fourth reference line is 0.5 degree to 10 degree.

The SiC ingot may have a 4H-SiC crystal structure, and a locking angle of a wafer prepared from the SiC ingot with an off angle to a (0001) plane of the SiC ingot set as 0 to 10 degree may be −1.5 degree to +1.5 degree relative to a reference angle.

A number of pits on a surface of the SiC ingot may be 10,000/cm$^2$ or less.

In another general aspect, a method for preparing a SiC ingot includes: disposing a SiCa raw material and a SiC seed crystal facing each other in a reactor having an internal space; subliming the raw material by controlling a temperature, a pressure, and an atmosphere of the internal space; and growing the SiC ingot on the SiC seed crystal; wherein the reactor includes a heat insulating material surrounding an outer surface of the reactor and a heating means disposed on the heat insulating material, and wherein a density of the heat insulating material is 14 g/cc to 28 g/cc, and a thickness of the heat insulating material is 20 mm to 300 mm.

The SiC ingot may include: a main body including a first cross-sectional plane of the main body and a second cross-sectional plane of the main body facing the first cross-sectional plane; and a protrusion disposed on the second cross-sectional plane and including a convex surface from the second cross-sectional plane of the main body, wherein a first end point disposed at one end of the second cross sectional plane, a second end point disposed at another end of the second cross sectional plane, and a peak point disposed on the convex surface are disposed on a third cross-sectional plane of the main body perpendicular to the first cross-sectional plane, and wherein a radius of curvature of an arc corresponding to a line of intersection between the third cross-sectional plane and the convex surface satisfies Equation 1 below:

$$3D \leq r \leq 37D \quad \text{[Equation 1]}$$

where r is the radius of curvature of an arc corresponding to a line of intersection between the third cross-sectional plane and the convex surface, and D is a length of a line of intersection between the first cross-sectional plane and the third cross-sectional plane.

The SiC ingot may include: a main body including a first cross-sectional plane of the main body and a second cross-sectional plane of the main body facing the first cross-sectional plane; and a protrusion disposed on the second cross-sectional plane and including a convex surface, wherein the SiC ingot includes a first reference line perpendicular to the first cross-sectional plane of the main body and passing through a center of the first cross-sectional plane of the main body, a second reference line parallel to the first reference line and in contact with an edge of the protrusion disposed farthest from the first reference in a vertical distance, a third reference line parallel to the first cross-sectional plane of the main body and passing through a contact point between the edge of the protrusion and the second reference line, and a fourth reference line passing through the contact point and the peak point of the convex surface, and wherein an angle between the third reference line and the fourth reference line is 0.5 degree to 10 degree.

In another general aspect, a method for preparing a SiC wafer includes grinding edges of the SiC ingot; and preparing the SiC wafer by cutting the ground SiC ingot.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
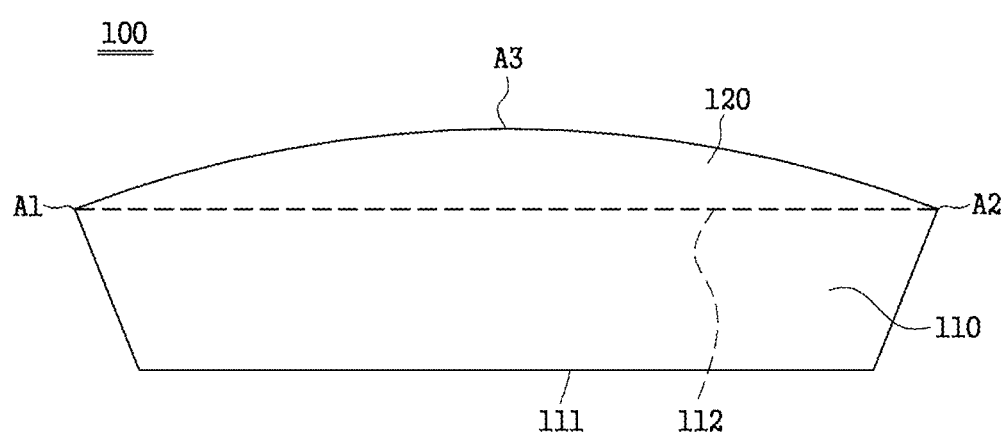
FIG. 1 is a front view of the SiC ingot according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, the phrase that a certain element "comprises" or "includes" another element means that the certain element may further include one or more other elements but does not preclude the presence or addition of one or more other elements, unless stated to the contrary.

Throughout the specification, when an element is "connected" to another element, this includes not only 'directly connected' but also 'connected with another element in the middle'.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Throughout the specification, the term "combination of" included in Markush type description means mixture or combination of one or more elements described in Markush type and thereby means that the disclosure includes one or more elements selected from the Markush group.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

As used herein, the term "and/or" includes any one and any combination of any two or more of the associated listed items; likewise, "at least one of" includes any one and any combination of any two or more of the associated listed items.

In the present specification, the articles "a," "an," and "the" are intended to include the plural forms as well, unless the context clearly indicates otherwise.

The present disclosure provides a SiC ingot, a method for preparing the SiC ingot, and a method for preparing a SiC wafer, which can precisely control the temperature gradient of the crystal growth, thus can provide a SiC ingot with excellent characteristics.

In an effort to develop a method for producing a SiC ingot with less defect and higher quality, the inventors was confirmed that, when growing a SiC using physical vapor transport (PVT), temperature control is important. While control of the temperature of the crucible body and the seed holder is important, it was also confirmed that control of the temperature of the heat insulating material disposed in the reaction chamber along with the crucible body is also important. Therefore, the inventors manufactured a SiC ingot with higher quality based on these findings.

Figure 2:
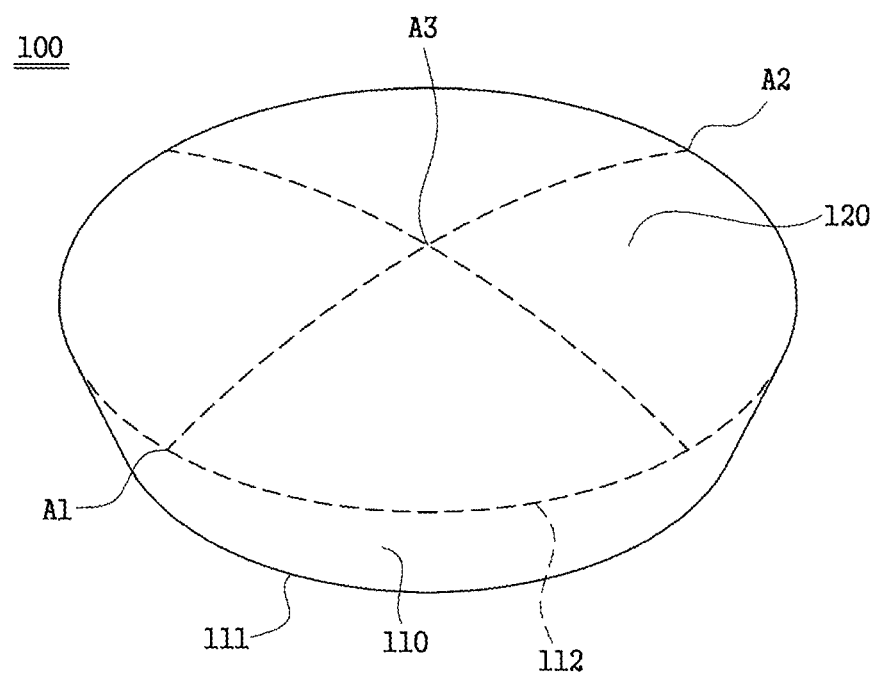
FIG. 2 is a perspective view of the SiC ingot according to an embodiment.
Figure 3:
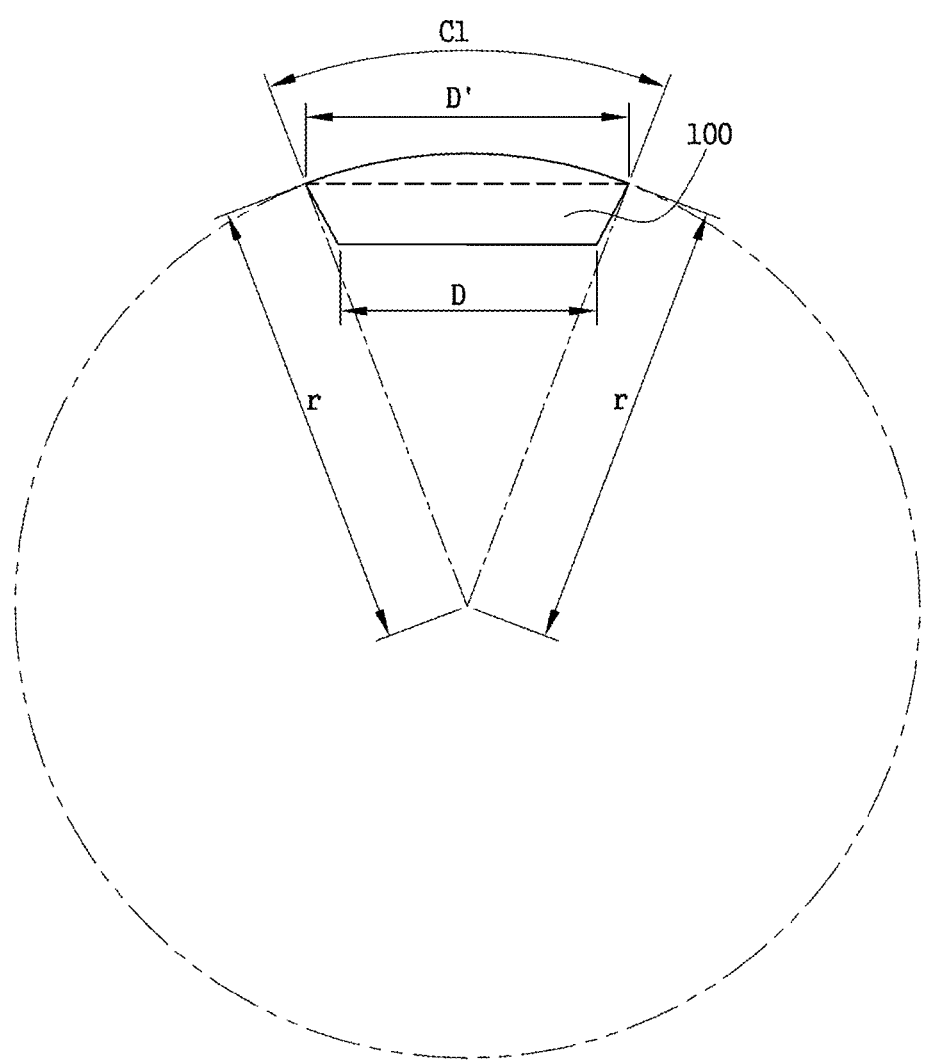
FIG. 3 is a conceptual view illustrating the SiC ingot and the radius of curvature of the convex surface of the protrusion of the SiC ingot according to an embodiment.

Referring to FIGS. 1 to 3, in one general aspect, a SiC ingot 100 includes: a main body 110 including a first cross-sectional plane 111 of the main body 110 and a second cross-sectional plane 112 of the main body 110 facing the first cross-sectional plane 111; and a protrusion 120 disposed on the second cross-sectional plane 112 and including a convex surface.

A first end point A1 is disposed at one end of the second cross-sectional plane 112. A second end point A2 is disposed at another end of the second cross sectional plane 112. A peak point A3 is disposed on the convex surface.

Referring to FIGS. 1 and 2, the first end point A1, the second end point A2, and the peak point A3 is disposed on a same plane, which is a third cross-sectional plane (not depicted). The third cross-sectional plane is perpendicular to the first cross-sectional plane 111.

Referring to FIG. 3, a radius r of curvature of an arc C1 corresponding to a line of intersection between the third cross-sectional plane and the convex surface satisfies Equation 1 below:

$$3D \leq r \leq 37D \quad \text{[Equation 1]}$$

where r is the radius r of curvature of the arc C1 corresponding to the line of intersection between the third cross-sectional plane and the convex surface, and D is a length of a line of intersection between the first cross-sectional plane 111 and the third cross-sectional plane.

The main body 110 and the protrusion 120 of the SiC ingot 100 are continuously grown from the SiC seed crystal 130 by the method for producing a SiC ingot, described herein. The SiC ingot 100 it is divided into the main body 110 and the protrusion 120 to explain an endpoint of growth of the SiC ingot 100, which is the curved surface of the SiC ingot 100, but it should be noted that the main body 110 and the protrusion 120 are successive identical crystals.

One end of the main body 110 may contact with the SiC seed crystal 130.

The main body 110 may be a cylindrical shape having an axis perpendicular to the first cross-sectional plane 111 and passing through a center of the first cross-sectional plane 111. An area of a cross section perpendicular to the axis may be same or increase along the axis from the first cross-sectional plane to the second cross-sectional plane.

The first cross-sectional plane 111 of the main body 110 may be the same as a cross-sectional plane of the SiC seed crystal 130, and it may be circular.

The first cross-sectional plane 111 and the second cross-sectional plane 112 of the main body 110 may be parallel and the main body 110 may have a shape selected from the group consisting of a cylinder, a truncated cone, an oblique cylinder, and an oblique truncated cone.

The protrusion 120 corresponds to a portion extending outwardly from the second cross-sectional plane 112 of the main body 110 and may have a convex surface.

The convex surface of the protrusion 120 may approximate a part of a sphere, whose curvature deviation is very small.

A first end point A1 is disposed at one end of the second cross-sectional plane 112. A second end point A2 is disposed at another end of the second cross sectional plane 112. A peak point A3 is disposed on the convex surface.

Referring to FIGS. 2 and 3, the third cross-sectional plane of the SiC ingot 100 is perpendicular to the first cross-sectional plane 111 of the main body 110. The convex surface may include the arc C1, which extends from the first end point A1, where the protrusion 120 and main body 110 contact each other, passes through the peak point A3 of the convex surface, and to the second end point A2, where the protrusion 120 and the main body 110 contact each other again.

When the second cross-sectional plane 112 of the main body 110 is circular, the arc C1 may be a curve, which extends from one end of the diameter D' of the second cross-sectional plane 112, passes through the peak point A3 of the convex surface, and to the other end of the diameter D' of the second cross-sectional plane 112.

The peak point A3 of the protrusion 120 may be a position on the protrusion 120, which is farthest from the first cross section 111 of the main body 110 in a vertical distance, and it may be a position corresponding to the top when measured from the bottom of the main body 110 of the SiC ingot 100.

The radius of curvature r of the arc C1 may be 3D to 37D, 4D to 28D, 5D to 19D or 5.4D to 9D. As described above, D may be a length of a line of intersection (a line where two planes intersect) between the first cross-sectional plane 111 and the third cross-sectional plane. Also, when the first cross-sectional plane 111 of the main body 110 is circular, D may be a diameter of the first cross-sectional plane 111 of the main body 110. Furthermore, D may be a diameter of the SiC seed crystal 130 in contact with the first cross-sectional plane 111 of the main body 110. The SiC ingot 100 having such a radius of curvature has a good temperature gradient during growth, such that variation in growth rate is not large, and cracks and surface pits are reduced, thereby resulting in high quality.

As shown in FIG. 3, the radius of curvature r of the arc C1 may be measured by considering the arc C1 of the convex surface of the protrusion 110 as a circular arc having a constant curvature when viewed from the front of the SiC ingot 100.

For example, using an image sensor such as a CCD and a CMOS, a digital front image of the protrusion 110 of the SiC ingot 100 is obtained, and the digital front image obtained is binarized through a reference such as a certain critical brightness. At least three coordinate samples are selected randomly from the binarized image of a curve of the surface of the protrusion, and then the radius of curvature r of the protrusion 120 may be approximated by calculating a radius of a circle including the coordinate samples. The coordinate samples may be selected from a start region, a top region, and an end region of the curve of the surface of the protrusion. The radius of curvature r may be obtained by calculating an average of the radius values obtained by repeating the process several times to dozens of times.

Specifically, in front of the SiC ingot 100, the height of the center of the protrusion 110 can be measured with a height gauge, a point facing 5 mm inward from the edge of the SiC ingot can be measured, and the top, bottom, left and right of the SiC ingot can be measured with a height gauge. Through the measured values, the front view of the SiC ingot is illustrated by a computer-aided design software, and the radius of curvature r may be calculated by approximating the arc C1 of the convex surface of the protrusion 110 of the SiC ingot 100 with a circle.

The SiC ingot 100 may substantially be a single crystal 4H-SiC structure with minimal defects or polymorphic mixing.

If the shape of the surface of the SiC ingot 100 is unintentionally formed as concave, it may be because a polymorphism such as 6H-SiC rather than 4H-SiC crystal is mixed, and it may cause deterioration of the quality of the SiC ingot 100. In addition, when the surface of the SiC ingot is excessively curved and protruded, cracks may occur in the ingot itself or may be damaged during wafer processing. Whether the SiC ingot 100 has an excessively curved shape is determined based on the radius of curvature r of the protrusion 110, as described above.

The SiC ingot 100 may have a diameter of at least 4 inches, at least 5 inches, further at least 6 inches. Specifically, the SiC ingot may have a diameter of 4 inches to 12 inches, 4 inches to 10 inches, or 4 inches to 8 inches. In the production of the SiC ingot 100, SiC seed crystals 130 may be appropriately used according to these characteristics.

The SiC ingot 100 may be grown on the C plane (000-1) of the SiC seed crystal 130.

The SiC ingot 100 may be processed into a SiC wafer using conventional methods. For example, the outer edge of the SiC ingot 100 is ground using a grinding equipment, and after slicing at a certain off angle and into a constant thickness, processing such as an edge grinding, a surface grinding, and a polishing may be performed.

Based on the wafer obtained by applying the off angle selected from 0 to 10 degree with respect to the (0001) plane from the SiC ingot 100, the wafer manufactured from the SiC ingot 100 may have a locking angle of −1.5 degree to +1.5 degree relative to the reference angle, −1.0 degree to +1.0 degree relative to the reference angle, −0.5 degree to +0.5 degree relative to the reference angle, or −0.3 degree to +0.3 degrees relative to the reference angle.

Specifically, the wafer having an off angle of 0 degree with respect to the (0001) plane from the SiC ingot 100 may have a locking angle of −1.5 degrees to +1.5 degrees relative to the reference angle, −1.0 degrees to +1.0 degrees relative to the reference angle, −0.5 degrees to +0.5 degrees relative to the reference angle, or −0.3 degrees to +0.3 degrees relative to the reference angle. The ingot having these characteristics has excellent crystalline properties.

Specifically, the wafer having an off angle of 4 degrees with respect to the (0001) plane from the SiC ingot 100 may have a locking angle of −1.5 degrees to +1.5 degrees relative to the reference angle, −1.0 degrees to +1.0 degrees relative to the reference angle, −0.5 degrees to +0.5 degrees relative to the reference angle, or −0.3 degrees to +0.3 degrees relative to the reference angle. The ingot having these characteristics has excellent crystalline properties.

Specifically, the wafer having an off angle of 8 degrees with respect to the (0001) plane from the SiC ingot 100 may have a locking angle of −1.5 degrees to +1.5 degrees relative to the reference angle, −1.0 degrees to +1.0 degrees relative to the reference angle, −0.5 degrees to +0.5 degrees relative to the reference angle, or −0.3 degrees to +0.3 degrees relative to the reference angle. The ingot having these characteristics has excellent crystalline properties.

The locking angle, which is related with the crystallinity of the wafer is evaluated as follows: a direction of the wafer [11-20] is aligned with a X-ray path of a high resolution X-ray diffraction analysis system (HR-XRD system); setting angles of the X-ray source optic and the X-ray detector optic to $2\theta$ (35 to 36 degrees); the rocking curve is determined by controlling an omega ($\omega$, or theta $\theta$, X-ray detector optic) angle to correspond to the off angle of the wafer; and the crystallinity is evaluated from the locking angle, which is obtained from a difference between the peak angle, which is a reference angle, and two full width at half maximum (FWHM) (hereinafter, same applies to the locking angle).

In the present disclosure, "an off angle of X degrees" means that it has an off angle evaluated as X degrees within a general error range, and for example, it includes an off angle in a range of (X−0.05 degrees) to (X+0.05 degrees).

In the present disclosure, the locking angle "−1 to +1 degree relative to the reference angle" means that the full width at half maximum is in the range of (peak angle−1 degree) to (peak angle+1 degree) with respect to the peak angle which is the reference angle.

In addition, a surface excluding a center part and a part within 5 mm from an edge to the center is divided substantially equally into three parts, and an average value of three or more measurements in each part is considered as the locking angle.

Specifically, of the wafers having an off angle of 0 degree to 8 degrees with respect to the (0001) plane of the SiC ingot 100, the omega angle is 17.8111 degree when the off angle is 0 degree, the omega angle is 13.811 degree when the off angle is 4 degree, and the omega angle is 9.8111 degree when and the off angle is 8 degree. The omega angle of wafers having the off angle of 0 degree to 8 degrees is in the range of 9.8111 degree to 17.8111 degree.

A number of pits on the surface of the SiC ingot 100 may be 10,000/$cm^2$ or less.

In the present specification, the number of pits on the surface of the SiC ingot 100 is evaluated by measuring a number of pits per unit area (cm$^2$) at five spots by observing the five spots with an optical microscope, and then evaluating the average value. Wherein the five spots are as follows: one spot in a center of a surface of the SiC ingot except for facets, and four spots located at 3, 6, 9, and 12 o'clock, and positioned approximately 10 mm inward from an edge to the center of the SiC ingot.

The SiC ingot 100 may provide a higher quality SiC wafer by reducing defects that may occur in the SiC ingot.

In another general aspect, a SiC ingot 100 includes: a main body 110 including a first cross-sectional plane 111 of the main body 110 and a second cross-sectional plane 112 of the main body 110 facing the first cross-sectional plane 111; and a protrusion 120 disposed on the second cross-sectional plane 112 and including a convex surface.

Figure 4:
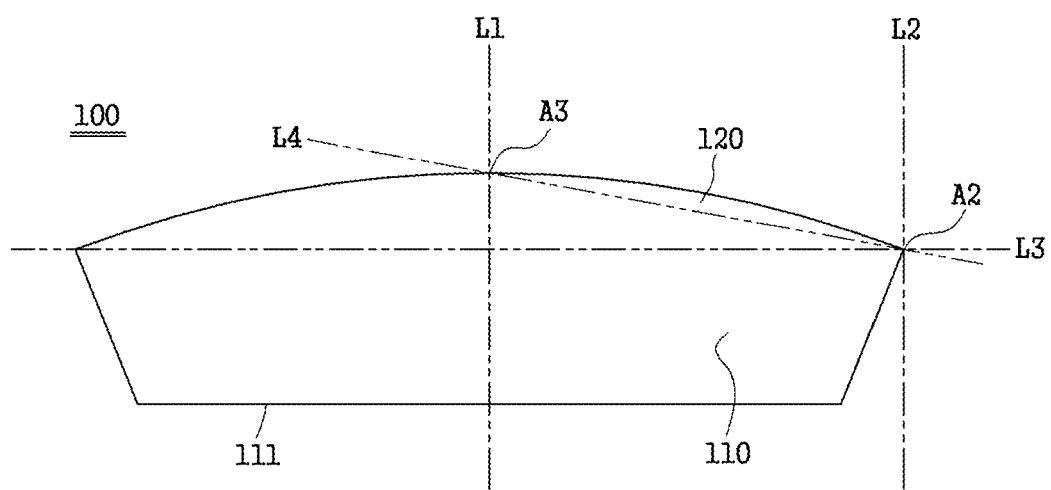
FIG. 4 is a conceptual view illustrating cross sections of the SiC ingot and the angle between the second cross-sectional plane and a reference line passing through the peak point and an interface between the second cross-sectional plane and the convex surface according to an embodiment.

Referring to FIG. 4, the SiC ingot includes the first to fourth reference lines L1 to L4. The first reference line L1 is perpendicular to the first cross-sectional plane 111 of the main body 110. The second reference line L2 is parallel to the first reference line L1 and in contact with an edge of the protrusion 120 disposed farthest from the first reference L1 in a vertical distance. The third reference line L3 is parallel to the first cross-sectional plane 111 of the main body 110 and passes through a contact point A2 between the edge of the protrusion 120 and the second reference line L2. The fourth reference line L4 passes through the contact point A2 and the peak point A3 of the convex surface. The angle between the third reference line L3 and the fourth reference line L4 is 0.5 degree to 10 degree.

The main body 110 and the protrusion 120 of the SiC ingot 100 are continuously grown from the SiC seed crystal 130 by the method for producing SiC ingot described herein. The SiC ingot 100 it is divided into the main body 110 and the protrusion 120 to explain an end point of growth of the SiC ingot 100, which is the curved surface of the SiC ingot 100, but it should be noted that the main body 110 and the protrusion 120 are successive identical crystals.

One end of the main body 110 may contact with the SiC seed crystal 130.

The main body 110 may be a cylindrical shape having an axis perpendicular to the first cross-sectional plane 111 and passing through a center of the first cross-sectional plane 111. An area of a cross section perpendicular to the axis may be same or increase along the axis from the first cross-sectional plane to the second cross-sectional plane.

The first cross-sectional plane 111 of the main body 110 may be the same as a cross-sectional plane of the SiC seed crystal 130, and it may be circular.

The first cross-sectional plane 111 and the second cross-sectional plane 112 of the main body 110 may be parallel and the main body 110 may have a shape selected from the group consisting of a cylinder, a truncated cone, an oblique cylinder, and an oblique truncated cone.

The protrusion 120 corresponds to a portion extending outwardly from the second cross-sectional plane 112 of the main body 110 and may have a convex surface.

The convex surface of the protrusion 120 may approximate a part of a sphere, whose curvature deviation is very small.

Referring to FIG. 4, the SiC ingot 100 may include the reference lines L1 to L4 as follows. The front surface of the SiC ingot 100 is shown in front view through the measured value of ingot measured by the height gauge and Autocad®, on the front view, the SiC ingot 100 may include the four reference lines L1 to L4. The first reference line L1 is perpendicular to the first cross-sectional plane 111 of the main body 110 and passes through a center of the first cross-sectional plane 111 of the main body 110. The second reference line L2 is parallel to the first reference line L1 and is in contact with an edge of the protrusion 120 farthest from the first reference line L1 in a vertical distance. The third reference line L3 is parallel to the first cross-sectional plane 111 of the main body 110 and passes through a contact point A2 between the edge of the protrusion 120 and the second reference line L2. The fourth reference line L4 passes through the contact point A2 and the peak point A3 of the convex surface. The angle between the third reference line L3 and the fourth reference line L4 is 0.5 degree to 10 degree.

The angle between the third reference line L3 and the fourth reference line L4 may be 0.5 to 10 degrees, 1 to 8 degrees, 2 to 6 degrees, or 3.2 to 5 degrees. The SiC ingot 100 with such an angle has a good temperature gradient during growth, so that variation in growth rate is not large, and cracks and surface pits are reduced, thereby resulting in high quality.

The SiC ingot 100 may substantially be a single crystal 4H-SiC structure with minimal defects or polymorphic mixing.

If the shape of the surface of the SiC ingot 100 is unintentionally formed as concave, it may be because a polymorphism such as 6H-SiC rather than 4H-SiC crystal is mixed, and it may cause deterioration of the quality of the SiC ingot 100. In addition, when the surface of the SiC ingot is excessively curved and protruded, cracks may occur in the ingot itself or may be damaged during wafer processing. Whether the SiC ingot 100 has an excessively curved shape is determined based on the angle between the third reference line L3 and the fourth reference line L4, as described above.

The SiC ingot 100 may have a diameter of at least 4 inches, at least 5 inches, further at least 6 inches. Specifically, the SiC ingot may have a diameter of 4 inches to 12 inches, 4 inches to 10 inches, or 4 inches to 8 inches. In the production of the SiC ingot, SiC seed crystals 130 may be appropriately used according to these characteristics.

The SiC ingot 100 may be grown on the C plane (000-1) of the SiC seed crystal 130.

The SiC ingot 100 may be processed into a SiC wafer using conventional methods. For example, the outer edge of the SiC ingot 100 is ground using a grinding equipment, and after slicing at a certain off angle and into a constant thickness, processing such as an edge grinding, a surface grinding, and a polishing may be performed a SiC Based on the wafer obtained by applying the off angle selected from 0 to 10 degree with respect to the (0001) plane from the SiC ingot 100, the wafer manufactured from the SiC ingot 100 may have a locking angle of −1.5 degree to +1.5 degree relative to the reference angle, −1.0 degree to +1.0 degree relative to the reference angle, −0.5 degree to +0.5 degree relative to the reference angle, or −0.3 degree to +0.3 degrees relative to the reference angle.

Specifically, the wafer having an off angle of 0 degree with respect to the (0001) plane from the SiC ingot 100 may have a locking angle of −1.0 degrees to +1.0 degrees relative to the reference angle, −0.5 degrees to +0.5 degrees relative to the reference angle, −0.1 degrees to +0.1 degrees relative to the reference angle, or −0.05 degrees to +0.05 degrees relative to the reference angle. The ingot having these characteristics has excellent crystalline properties.

Specifically, the wafer having an off angle of 4 degrees with respect to the (0001) plane from the SiC ingot 100 may have a locking angle of −1.0 degrees to +1.0 degrees relative to the reference angle, −0.5 degrees to +0.5 degrees relative to the reference angle, −0.1 degrees to +0.1 degrees relative to the reference angle, or −0.05 degrees to +0.05 degrees relative to the reference angle. The ingot having these characteristics has excellent crystalline properties.

Specifically, the wafer having an off angle of 8 degrees with respect to the (0001) plane from the SiC ingot 100 may have a locking angle of −1.0 degrees to +1.0 degrees relative to the reference angle, −0.5 degrees to +0.5 degrees relative to the reference angle, −0.1 degrees to +0.1 degrees relative to the reference angle, or −0.05 degrees to +0.05 degrees relative to the reference angle. The ingot having these characteristics has excellent crystalline properties.

The locking angle, the off angle of X degrees, the locking angle of "−1 to +1 degrees relative to the reference angle", the omega angle, and the descriptions thereof may be the same as described above.

The number of pits on the surface of SiC ingot 100 may be 10,000/cm² or less.

The measurement of the number of pits on the surface of the SiC ingot 100 may be the same as described above.

A SiC wafer with a higher quality may be provided from the SiC ingot 100 by reducing defects that may occur in the SiC ingot.

In another general aspect, a method for preparing a SiC ingot 100 includes: a SiCa SiC disposing a raw material 300 and a SiC seed crystal 130 facing each other in a reactor 200 having an internal space; subliming the raw material 300 by controlling a temperature, a pressure, and an atmosphere of the internal space; and growing the SiC ingot 100 on the SiC seed crystal 130; wherein the reactor 200 includes a heat insulating material 400 surrounding an outer surface of the reactor 200 and a heating means 500 disposed on the heat insulating material 400, and wherein a density of the heat insulating material 400 is 14 g/cc to 28 g/cc, and a thickness of the heat insulating material 400 is 20 mm to 300 mm.

Figure 5:
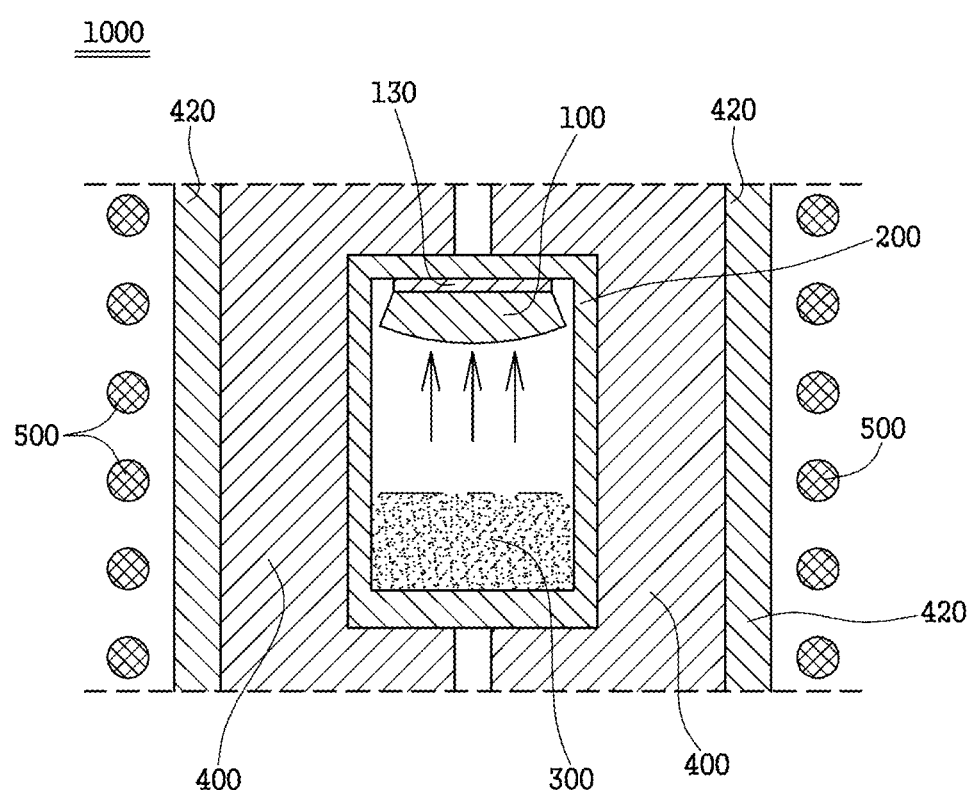
FIG. 5 is a conceptual view illustrating a cross section of the device for manufacturing the SiC ingot according to an embodiment.

The raw material 300 is disposed at the bottom of the reactor 200 as shown in FIG. 5, and the SiC seed crystal 130 is disposed at the top of the reactor 200, so that the SiC raw material 300 is sublimed to the SiC seed crystal 130 to form the SiC ingot 100.

The reactor 200 may be used as long as it is a container suitable for the growth reaction of the SiC ingot 100, specifically, a graphite crucible may be used.

For example, the reactor 200 may include an internal space, a main body (not shown) comprising an opening and a cover (not shown) corresponding to the opening to seal the internal space.

The crucible cover may further include a seed crystal holder (not shown) integrated with or separately from the crucible cover, and the SiC seed crystal 130 may be disposed on the seed crystal holder.

The reactor 200 may be surrounded by a heat insulating material 400, and the heat insulating material 400 surrounding the reactor 200 may be disposed in a reaction chamber 420, such as a quartz tube. The temperature of the internal space of the reactor 200 may be controlled by the heating means 500 disposed outside of the heat insulating material 400 and the reaction chamber 420.

The growth of the SiC ingot 100 may vary depending on the size, type, and raw material of the reactor 200, and the quality of the SiC ingot 100 may change depending on the temperature gradient of an internal space of the reactor 200 during the growing step. Also, the quality of a SiC ingot may vary depending on a degree of insulation of the reactor, and thus the characteristics of the heat insulating material 400 are important factors. That is, the temperature gradient inside the reactor 200 in the growing step may vary depending on the heat insulating material 400 used.

The heat insulating material 400 may have a density of 0.14 g/cc to 0.28 g/cc, 0.14 g/cc to 0.25 g/cc, or 0.14 g/cc to 0.19 g/cc. When the density of the heat insulating material 400 is less than 0.14 g/cc, the growth portion of the SiC ingot 100 may be curved concave and dented in a subsequent step, and 6H-SiC polymorphism may occur, resulting in poor ingot quality. When the density of the heat insulating material 400 is greater than 0.28 g/cc, the growth portion of the SiC ingot 100 may be excessively curved and protrude, and the low growth rate of the edge may reduce the yield or increase the ingot cracking. When the density is in the range of 0.14 g/cc to 0.24 g/cc, the quality of the ingot may be improved, and when the density is in the range of 0.14 g/cc to 0.19 g/cc, the crystal growth atmosphere may be controlled and an ingot with a better quality may be obtained.

The heat insulating material 400 may have a porosity of 72% to 95%, 75% to 93%, or 80% to 91%. When the heat insulating material 400 having the porosity range as defined above is used, it may further reduce the formation of cracks The heat insulating material 400 may have a compressive strength of 0.2 Mpa or more, 0.48 Mpa or more, or 0.8 MPa or more. Also, the heat insulating material 400 may have a compressive strength of 3 MPa or less, or 2.5 MPa or less. When the heat insulating material has such compressive strength, the thermal/mechanical stability of the heat insulating material 400 is excellent, and the probability of occurrence of ash is reduced, thereby high quality SiC ingots can be produced.

The heat insulating material 400 may include a carbon-based felt, specifically, a graphite felt, a rayon graphite felt, and a pitch-based graphite felt.

The heat insulating material 400 may have a thickness of 20 mm or more, or 30 mm or more. In addition, the heat insulating material 400 may have a thickness of 300 mm or less, 200 mm or less, or 150 mm or less. The heat insulating material 400 within the ranges defined above may minimize the waste of resources and have sufficient insulation effect.

When the reactor 200 is applied to a crucible, the crucible may have a thickness of 10 mm or more, or 12 mm or more. In addition, the crucible may have a thickness of 30 mm or less, 20 mm or less, or 15 mm or less. The crucible within the ranges defined above has a high heat efficiency, such that power wastage may be minimized, and achieves a sufficient heat effect.

During the growth of the SiC ingot 100 on the SiC seed crystal 130, the SiC raw material 130 is sublimated by controlling temperature, pressure and gas atmosphere of the internal space of the reactor 200a SiC.

The growth may be performed by heating the reactor 200 and the internal space of the reactor 200 by the heating means 500 reducing the pressure simultaneously or separately with the heating, and injecting an inert gas into the reactor 200.

The growth may be performed at a temperature of 2000° C. to 2500° C. and a pressure condition of 1 torr to 200 torr. Within the ranges of temperature and pressure defined above, the SiC ingot may be prepared more efficiently.

Specifically, the growth may be performed under the condition that the temperature of the surface of top and bottom the reactor 200 is 2100° C. to 2500° C. and the pressure of the internal space of the reactor 200 is 1 torr to 50 torr. More specifically, the temperature of the surface of top and bottom may be 2150° C. to 2450° C. and the pressure of the internal space of the reactor may be 1 torr to 40 torr. Still more specifically, the temperature of the surface of top and bottom may be 2150° C. to 2350° C. and the pressure of the internal space of the reactor may be 1 torr to 30 torr.

Within the ranges of the temperature and pressure defined above, a higher quality SiC ingot may be produced.

Various SiC seed crystals 130 may be used depending on the characteristics of the SiC ingot 100 to be grown. For example, 4H-SiC wafer, 6H-SiC wafer, 3C-SiC wafer, 15R-SiC wafer, etc. may be used, but is not limited thereto.

Also, the SiC seed crystal 130 may be used differently depending on the size of the SiC ingot 100 to be grown. The diameter of the SiC ingot 100 may be 4 inches or more, specifically, 5 inches or more, further 6 inches or more. More specifically, the diameter of the SiC ingot may be 4 inches to 12 inches, 4 inches to 10 inches, or 4 inches to 8 inches. The SiC seed crystal 130 may be used depending on the characteristics of these ingots.

Various SiC seeds 110 may be used as long as it is capable of growing a 4H-SiC single crystal, for example, 4H-SiC seed, whose front surface where the SiC ingot 100 grows is C plane (000-1) may be used.

The raw material 300 may be a powder form having a carbon source and a silicon source. The powder may be raw materials necked to each other or a SiC powder having a carbonized surface.

The SiC ingot 100 formed may be consist of 4H-SiC crystals, and the surface of the growth portion facing the SiC raw material 300 may have a curved protrusion or be a flat form.

The SiC ingot 100 produced by the above method may be a 4H-SiC ingot, which is substantially a single crystal, whose defects or polymorphisms are minimized.

The SiC ingot 100 is substantially made of 4H SiC, the surface may be convex or flat form.

If the shape of the surface of the SiC ingot 100 is unintentionally formed as concave, it may be because a polymorphism such as 6H-SiC rather than 4H-SiC crystal is mixed, and it may cause deterioration of the quality of the SiC ingot 100. In addition, when the surface of the SiC ingot is excessively curved and protruded, cracks may occur in the ingot itself or may be damaged during wafer processing. Whether the SiC ingot 100 has an excessively curved shape is determined based on the radius of curvature r of the protrusion 110, as described above.

Whether the SiC ingot 100 produced by the manufacturing method described above has an excessively convex shape may be determined based on the radius of curvature r of the protrusion 110, as described above. Also, it can be determined based on the angle θ between the second cross-sectional plane 112 and the reference line R, as described above.

The SiC ingot 100 manufactured by the manufacturing method may provide a higher quality SiC wafer by minimizing defects that may occur in the SiC ingot 100.

The SiC ingot 100 manufactured by the above method may be processed into a wafer in the manner described herein.

Based on the wafer obtained by applying the off angle selected from 0 to 10 degree with respect to the (0001) plane from the SiC ingot 100, the wafer manufactured from the SiC ingot 100 may have a locking angle of −1.5 degree to +1.5 degree relative to the reference angle, −1.0 degree to +1.0 degree relative to the reference angle, −0.1 degree to +0.1 degree relative to the reference angle, or −0.05 degree to +0.05 degrees relative to the reference angle.

Specifically, the wafer having an off angle of 0 degree with respect to the (0001) plane from the SiC ingot 100 manufactured by the above method may have a locking angle of −1.0 degrees to +1.0 degrees relative to the reference angle, −0.5 degrees to +0.5 degrees relative to the reference angle, −0.1 degrees to +0.1 degrees relative to the reference angle, or −0.05 degrees to +0.05 degrees relative to the reference angle. The ingot with these characteristics has excellent crystalline properties.

Specifically, the wafer having an off angle of 4 degrees with respect to the (0001) plane from the SiC ingot 100 manufactured by the above method may have a locking angle of −1.0 degrees to +1.0 degrees relative to the reference angle, −0.5 degrees to +0.5 degrees relative to the reference angle, −0.1 degrees to +0.1 degrees relative to the reference angle, or −0.05 degrees to +0.05 degrees relative to the reference angle. The ingot with these characteristics has excellent crystalline properties.

Specifically, the wafer having an off angle of 8 degrees with respect to the (0001) plane from the SiC ingot 100 manufactured by the above method may have a locking angle of −1.0 degrees to +1.0 degrees relative to the reference angle, −0.5 degrees to +0.5 degrees relative to the reference angle, −0.1 degrees to +0.1 degrees relative to the reference angle, or −0.05 degrees to +0.05 degrees relative to the reference angle. The ingot with these characteristics has excellent crystalline properties.

The locking angle, the off angle of X degrees, the locking angle of "−1 to +1 degrees relative to the reference angle", the omega angle, and the descriptions thereof may be the same as described above.

The number of pits on the surface of SiC ingot 100 may be 10,000/cm$^2$ or less.

The measurement of the number of pits on the surface of the SiC ingot 100 may be the same as described above.

In another general aspect, a method for preparing a SiC wafer includes grinding edges of the SiC ingot 100; and preparing the SiC wafer by cutting the ground SiC ingot 100.

In the grinding step, at least 5% of the cross-sectional area of the SiC ingot 100 may be ground inward from the edges.

In the grinding step, the SiC ingot 100 may be ground to have uniform cross sections from the first cross-sectional plane 111 of the main body 110 to the second cross-sectional plane 112 of the main body 110. Also, the SiC ingot 100 may be ground to have uniform cross sections in a direction toward the central axis.

In the cutting step, the SiC ingot 100 may be cut to have a certain off angle with respect to the first cross-sectional plane 111 or (0001) plane.

In the cutting step, the off angle may be 0 degree to 10 degrees.

The cutting step may be performed such that the thickness of the wafer is 300 μm to 600 μm.

The method of manufacturing the SiC wafer may further include planarizing the thickness of the wafer after the cutting step.

The method of manufacturing the SiC wafer may further include grinding the edge of the wafer after the cutting step.

The method of manufacturing the SiC wafer may further include surface-treating the wafer by etching and polishing the surface of the wafer after the cutting step.

The planarizing, the grinding, and the surface-treating may be performed by conventional methods and may be performed in the order of planarizing-grinding-surface-treating.

Hereinafter, while embodiments of the present disclosure will be described in more detail with reference to the accompanying examples, it should be noted that examples are not limited to the following.

Preparation of the SiC Ingot

As shown a SiC in FIG. 5, the SiC raw material 300 was disposed at the bottom of internal space of the reactor 200, and the SiC seed crystal 130 was disposed at the top of the reactor 200. The SiC seed crystal 130 consisting of 6 inch 4H-SiC crystal was used, and the C plane (000-1 plane) was fixed to face the SiC raw material 300 at the bottom of internal space. The same applies to the following examples and comparative examples.

After the reactor 200 was sealed and the outside of the reactor 200 was surrounded by the heat insulating material 400 having the characteristics shown in Table 1, the reactor 200 was disposed in the reaction chamber 420 provided with a heating coil as the heating means 500. Rigid Felt of Morgan Co. was used as the heat insulating material 400, and the thickness thereof was 30 mm to 100 mm.

The internal space of the reactor 200 was depressurized to a vacuum atmosphere, and argon gas was injected to the internal space to reach back to an atmospheric pressure, and then the internal space was depressurized again. At the same time, the temperature of the internal space was raised to 2300° C.

SiC ingot was grown on the SiC seed crystal facing the SiC raw material for 100 hours under a temperature of 2300° C. and a pressure of 20 torr.

An Evaluation on the Properties of SiC Ingots

1) Evaluation for the curvature radius r: At the front side of the SiC ingot 100, the maximum height of the protrusion 120 was measured with a height gauge, and a point facing 5 mm inward from the edge of the SiC ingot was measured. The top, bottom, left and right sides of the SiC ingot were measured by the height gauge. Referring to FIGS. 1 and 2, a front view perpendicular to the first cross-sectional plane 111 of the SiC ingot 100, which includes one point A1 of the edge where the protrusion 120 and the main body 110 contact, the highest point A3 of the protrusion 120, and the other point A2 of the edge where the protrusion 120 and the main body 110 contact, is illustrated using auto Cad®. The radius r of curvature of the convex surface was calculated by approximating the curve of the convex surface of the protrusion 120 of the SiC ingot 100 with an arc containing the three points A1, A3, and A2. In addition, wherein the front view, the length D of the line of intersection between the first cross-sectional plane 111 and the third cross-sectional plane, which includes the arc, was measured. The length D corresponds to the bottom width of the main body 110 in FIG. 1. The results are shown in Table 1 below.

2) Evaluation for the angle between the between the third reference line L3 and the fourth reference line L4: On the front view shown in 1) above, the first to fourth reference lines L1 to L4 are drawn. The first reference line L1 is perpendicular to the first cross-sectional plane 111 of the main body 110. The second reference line L2 is parallel to the first reference line L1 and in contact with an edge of the protrusion 120 disposed farthest from the first reference L1 in a vertical distance. The third reference line L3 is parallel to the first cross-sectional plane 111 of the main body 110 and passes through a contact point A2 between the edge of the protrusion 120 and the second reference line L2. The fourth reference line L4 passes through the contact point A2 and the peak point A3 of the convex surface. The angle (less than 90 degrees) between the third reference line L3 and the fourth reference line L4 was measured, and the results are shown in Table 1.

3) Evaluation of the locking angle: Wafers to which each off angle listed in Table 2 below based on surface of the ingot (0001) were prepared. A direction of the wafer [11-20] was aligned with a X-ray path of a high resolution X-ray diffraction analysis system (HR-XRD system, Rigaku's SmartLab High Resolution X-ray Diffraction System). After setting the X-ray source optic and X-ray detector optic angle to 2θ (35 to 36 degrees), the rocking angle was measured by controlling the omega (w, or theta θ, X-ray detector optic) angle to correspond to the off angle of the wafer. Specifically, the omega angle was 17.8111 degree based on 0 degree off, the omega angle was 13.811 degree based on 4 degree off, and the omega angle was 9.8111 degree based on 8 degree off. X-ray power was 9 kW, X-ray target was Cu, and Goniometer resolution was 0.0001 degree. The FWHM was measured based on the angle at Max Intensity and evaluated as the rocking angle, and the results are shown in Table 2 below.

The following results are shown by averaging the results obtained by measuring at least three or more times in each part by dividing the surface into three parts, excluding the parts within 5 mm from the center and the edge of the wafer.

4) Polymorphism: The polymorphism of the grown ingot was evaluated by UV-induced emission image analysis. When there was polymorphism, it was evaluated as fail and when polymorphism was not observed, it was evaluated as pass. The results are shown in Table 1 below.

5) Number of pits of the surface of an ingot: Five spots including one spot, located at the center of the surface of the SiC ingot except for facets, and four spots located at 3, 6, 9, and 12 o'clock, and positioned approximately 10 mm inward from the edge to the center of the SiC ingot, were selected. A total of five spots were measured with an optical microscope and the average value was given as the number of pit value of Table 1 below.

TABLE 1

|  | Felt density [g/cc] | Line of intersection between one cross section of ingot D(mm) | curvature radius r (mm) | angle ⊖ (°) | Number of pits on the surface of ingot (/cm²) | Polymorphism |
| --- | --- | --- | --- | --- | --- | --- |
| Example 1 | 0.16 | 150 | 1230 | 3.5 | 4,000 | Pass |
| Example 2 | 0.16 | 150 | 1345 | 3.2 | 5,000 | Pass |
| Example 3 | 0.17 | 150 | 1077 | 4 | 5,000 | Pass |
| Example 4 | 0.17 | 125 | 763 | 4.8 | 8,000 | Pass |
| Example 5 | 0.17 | 100 | 540 | 5 | 10,000 | Pass |
| Example 6 | 0.25 | 150 | 586 | 4.9 | 9,600 | Pass |
| comparative example 1 | 0.13 | 100 | 253 | 11 | 15,000 | Fail |
| comparative example 2 | 0.29 | 100 | 236 | 11.3 | 24,000 | Fail |

TABLE 2

| | Wafer Off angle | XRD [11-20] | | | | | |
|---|---|---|---|---|---|---|---|
| | | Angle at Max Intensity | Rocking angle | Angle at Max Intensity | Rocking angle | Angle at Max Intensity | Rocking angle |
| Example 1 | 0° | 17.811° | ±0.05° | — | — | — | — |
| Example 2 | 0° | 17.811° | ±0.05° | — | — | — | — |
| Example 3 | 4° | — | — | 13.811° | ±0.06° | — | — |
| Example 4 | 4° | — | — | 13.811° | ±0.11° | — | — |
| Example 5 | 8° | — | — | — | — | 9.811° | ±0.15° |
| Example 6 | 4° | | | 13.811° | ±0.1° | | |
| comparative example 1 | 0° | 17.811° | ±1.8° | — | — | — | — |
| comparative example 2 | 0° | 17.811° | ±1.7° | — | — | — | — |

Referring to Tables 1 and 2, the samples according to the examples disclosed herein were excellent in physical properties compared to the comparative example, particularly, in terms of locking angle.

There was a relatively large difference in the curvature radius r, the angle between the third reference line L3 and the fourth reference line L4, and the number of pits on the surface of ingot of SiC ingot grown under the same conditions, depending on the density of the felt of the heat insulating material used. The results indicate that the density of the felt is related with controlling the growth step.

There is a difference in the crystal quality of the wafer applying an off angle based on the ingot (0001) plane selected between 0 and 8 degrees, in particular, a large difference in the locking angle.

Figure 6A:
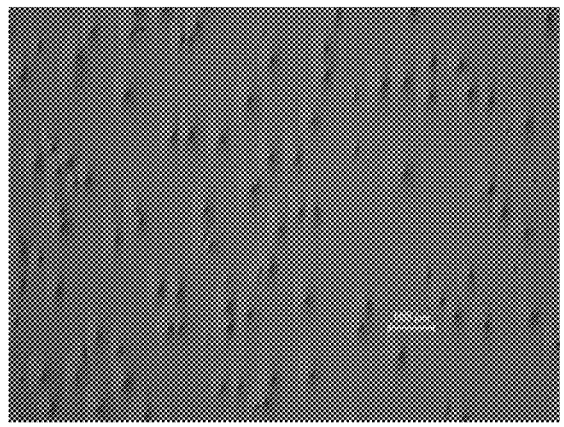
FIGS. 6A and 6B are images of the surface of the SiC ingot having a number of pits of 20,000/cm$^2$ (6A) and the surface of the SiC ingot according to an embodiment (6B).
Figure 6B:
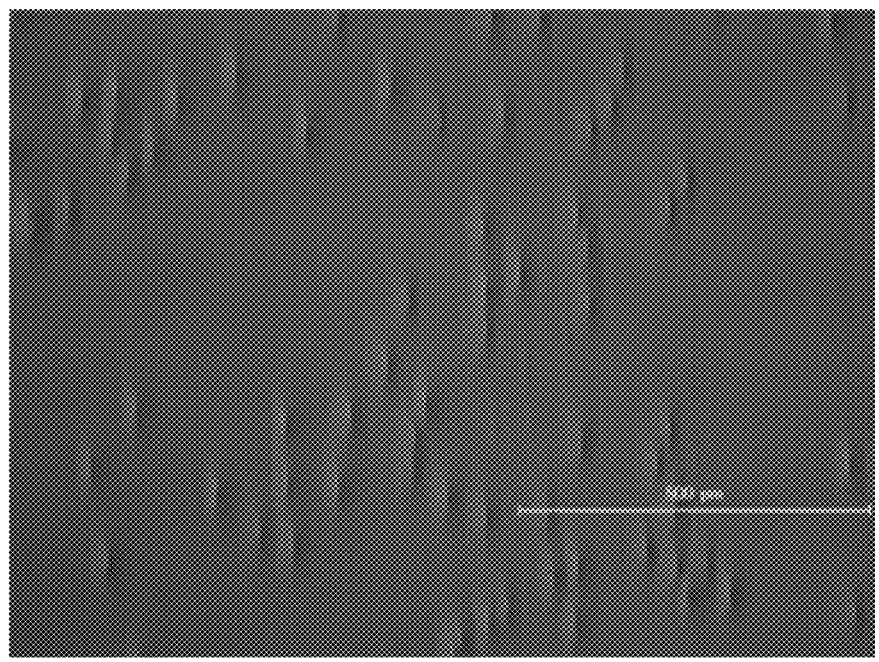

FIG. 6A is an image of the surface of a SiC ingot having a number of pits of 20,000/cm², and FIG. 6B is an image of the surface of a SiC ingot according to example 6. The images show that the defect density is significantly reduced in FIG. 6B.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A SiC ingot, comprising:
   a main body comprising a first cross-sectional plane of the main body and a second cross-sectional plane of the main body facing the first cross-sectional plane; and
   a protrusion disposed on the second cross-sectional plane and comprising a convex surface,
   wherein the SiC ingot comprises a first reference line perpendicular to the first cross-sectional plane of the main body and passing through a center of the first cross-sectional plane of the main body, a second reference line parallel to the first reference line and in contact with an edge of the protrusion disposed farthest from the first reference in a vertical distance, a third reference line parallel to the first cross-sectional plane of the main body and passing through a contact point between the edge of the protrusion and the second reference line, and a fourth reference line passing through the contact point and a peak point of the convex surface, and
   wherein an angle between the third reference line and the fourth reference line is 3.2 degree to 5 degree.

2. The SiC ingot of claim 1, wherein the SiC ingot comprises a 4H-SiC crystal structure, and a locking angle of a wafer prepared from the SiC ingot with an off angle to a (0001) plane of the SiC ingot set as 0 to 10 degree is −1.5 degree to +1.5 degree relative to a reference angle.

3. The SiC ingot of claim 1, wherein a number of pits on a surface of the SiC ingot is 10,000/cm² or less.

4. A method for preparing a SiC wafer comprising:
   grinding edges of the SiC ingot of claim 1; and
   preparing the SiC wafer by cutting the ground SiC ingot.

* * * * *